United States Patent [19]

Groce

[11] 3,979,700

[45] Sept. 7, 1976

[54] VIDEO PROCESSOR

[75] Inventor: John C. Groce, Woodland Hills, Calif.

[73] Assignee: International Telephone and Telegraph Corporation, New York, N.Y.

[22] Filed: Aug. 1, 1974

[21] Appl. No.: 493,673

[52] U.S. Cl. .............................. 333/30 R; 310/9.8; 333/70 T; 333/72; 340/173.2
[51] Int. Cl.² ..................... H03H 9/26; H03H 9/32; H03H 9/30; G11C 11/22
[58] Field of Search ................. 178/6, 6.8, DIG. 21, 178/6.8 TC, DIG. 25; 333/30 R, 72, 70 T, 28 R; 310/8.1, 8.2, 9.8; 330/174, 5.5; 340/173.2; 235/181

[56] References Cited
UNITED STATES PATENTS

| | | | |
|---|---|---|---|
| 3,030,440 | 4/1962 | Schade, Sr. .................... | 178/DIG. 25 |
| 3,678,401 | 7/1972 | Adler .................................. | 330/5.5 |
| 3,736,587 | 5/1973 | Bush et al. .............................. | 333/72 |
| 3,781,721 | 12/1973 | Judd et al. ......................... | 333/30 R |

*Primary Examiner*—Alfred E. Smith
*Assistant Examiner*—Marvin Nussbaum
*Attorney, Agent, or Firm*—William T. O'Neil

[57] ABSTRACT

A video signal processor for repetitive line data, such as the typical TV horizontal scan line. An acoustic surface wave delay line comprising a piezoelectric substrate with an input wave launcher and a plurality of interdigital taps is provided. The video signal line "fits" in the overall delay and electronic circuits (preferably of the integrated circuit type) are connected to the taps. Individual taps each have a weighting amplifier weighting from line center to early and late extremes, and their outputs are summed on the same basis. The sum has a polarity indicative of the signal line centroid sense vis-a-vis the line center and has an amplitude indicative of centroid spacing with respect to said line center.

10 Claims, 3 Drawing Figures

VIDEO PROCESSOR

BACKGROUND OF THE DISCLOSURE

1. Field of the Invention

The invention relates to video signal processing in general and more particularly, to video signal processing of repetitive scan data for centroid determination.

2. Description of the Prior Art

Processing of video signals resulting from a scanning process in order to locate a centroid representative of the "center of mass" of a target or target group, has been accomplished in various ways in prior art. Known methods and apparatus for performing this type of video processing, for example to generate missile tracking signals, involve either analog energy storage and comparison or digital processing and logic circuit comparison. Approaches to the general problem based on either of the foregoing generalizations have several inherent problems.

Systems involving analog energy storage are generally troubled by drift problems caused by temperature and/or operating supply potential variations. Also, the circuit parameters presented by various components in electrical circuits (e.g., resistors, capacitors, etc.), tend to change with age, thus requiring periodic recalibration. This is a particularly serious situation for items which must have a long shelf life and yet must operate properly when placed in service. In guided missile systems the overall instrumentation must be prepared to function at any time, without time allowance for calibration or checkout processes.

In respect to digital processing and logic comparison to provide the tracking signals, another set of problems accrue. Although digital processing can be made inherently free of drift problems which trouble the aforementioned analog systems, they tend to be more complex, require analog-to-digital converters, and are relatively expensive.

The manner in which the present invention deals with the shortcomings of the prior art by means of a novel approach to the problem, will be evident as this description proceeds.

SUMMARY OF THE INVENTION

The present invention utilizes an unusual combination of analog (surface wave acoustics) and digital (large scale integrated logic) techniques to surmount the problems of prior art systems for the general purposes aforementioned.

Although the present invention has broad application wherever a time (or location) weighted output (centroid) is required to be generated very rapidly and where small size, reliability and low cost are important, the specific application to be described hereinafter is based on an arrangement for locating the centroid of a TV scan line of signals, based on video levels. Such systems are required in visual guided missile tracking equipment and elsewhere in the electronic arts.

Other applications of the present invention include real time processing of wideband video data and automatic real time generation of missile guidance signals using infrared, radiometric, or radar sensors as well as the aforementioned visual TV tracking arrangements. In the real time processing of wide band video, the bandwidth can be much greater than the common 4MHz commercial television bandwidth, however, the parameters of the particular embodiment hereinafter described, are based on the common 62 microsecond television scan line. Thus, each video repetition interval or TV scan line is 62 microseconds in duration.

The invention employs a surface wave acoustic delay line which comprises a piezoelectric substrate excited by an interdigital transducer excited from a video modulated radio frequency carrier source. A large plurality of interdigital electrode pairs are spaced along the piezoelectric substrate material. Each of these electrodes (or finger pair taps) picks up a voltage signal generated by the piezoelectric material as a result of its excitation from the input transducer. Each of the said finger pair taps supplies a detector/weighting amplifier, and each of those amplifiers weights its output signal in accordance with its position from the center of the line. The taps closest to the input transducer receive greatest weighting, and taps closest to the center, the least weighting. From the center of the line to the opposite end, the amplifiers also reverse the polarity of the received signal and continue the weighting so that those amplifiers corresponding to finger pairs closest to the end of the line are weighted the same as those near the beginning of the line.

A plurality of first summing circuits sum "from the outsides in", i.e., the first finger pair amplifier output is summed against the last finger pair output; the second finger pair amplifier output against the N−1 finger pair amplifier output; the third finger pair amplifier output against the N−2 output, etc. Thus for N finger pair taps, N/2 of these first summers are required. The outputs of these first summers are combined in a single second level summer, the output of which has a polarity indicative of a scan line signal centroid on one side or the other of mid-scan (the center line of the finger pair area on the piezoelectric substrate). The magnitude of this second level summer output indicates distance (or time) from mid-scan corresponding to the location of the said centroid.

The general objective of the invention may be said to have been the development of a technique and apparatus for locating the centroid of a signal pattern on a repetitive data line (such as a TV scan line) based upon video levels. The details of the implementation of the present invention are presented in the description of the preferred embodiment later in this specification.

DESCRIPTION OF THE PREFERRED EMBODIMENT

Figure 1:
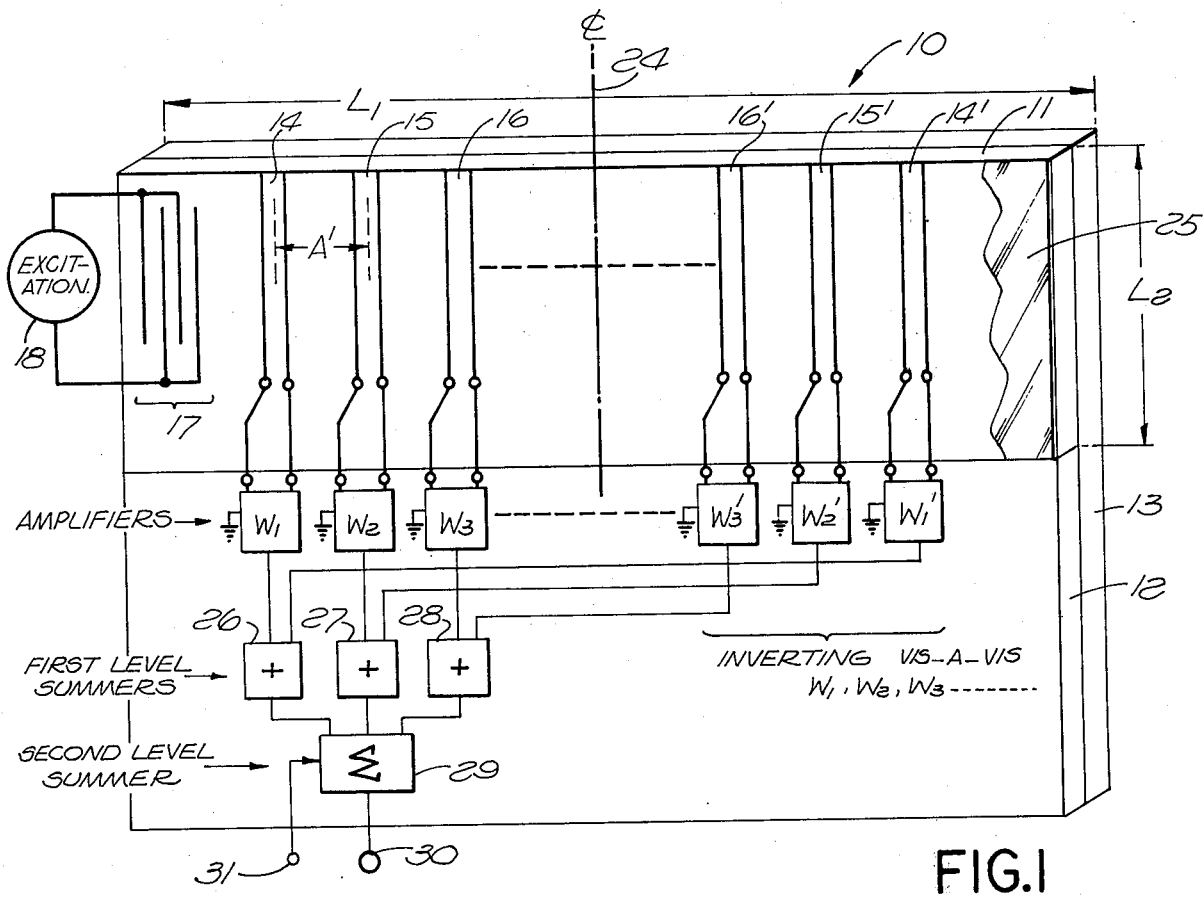
FIG. 1 is a schematic block diagram and general layout pictorial of a device in accordance with the invention.

Referring now to FIG. 1, a typical embodiment of the present invention is depicted generally at 10. Certain exaggerations and simplifications have been made in the showing, and these will be evident as the description proceeds.

This typical embodiment was designed to accommodate a signal line of 62 microseconds in duration (a typical television scan line duration). The typical television bandwidth of 4 MHz was contemplated, and a number of finger pair taps (corresponding to 14, 15, 16 and 14', 15' and 16' to illustrate just a few) was set at 500. The piezoelectric substrate 11 in cooperation with the 500 finger pair taps constitute the main elements of a surface acoustic wave interdigital delay line. Such delay lines all known per se, in the prior art, and have been described in the technical literature. For example, a document cataloged by the Institute of Electrical and Electronic Engineers as No. 73 CHO 807-8 SU, contains the proceedings of the IEEE (Group on Sonics and Ultra-Sonics) Ultra-Sonics Symposium conducted at the Naval Post Graduate School, Monterey, California, in November 1973. That document is one reference which would serve to acquaint the reader, not otherwise fully knowledgeable in the prior art in this connection, with the type of device contemplated for this element of the combination of the present invention.

The piezoelectric material selected for the substrate 11 was lithium niobate (Li Nb O$_3$), although there are many other piezoelectric materials which would be considered workable in this configuration, and, in fact, the choice of this material is subject to certain environmental and other critera. For example, the lithium niobate provides a high electromechanical coupling co-efficient although its temperature stability in inferior to some other piezoelectric materials. That is to say, a given surface magnitude produces a relatively large electrical signal in the so-called finger pair taps (14, 15 and 16, 14', 15' and 16' typically, as previously indicated), and vice versa. The material was Y cut Z propogating particular application.

Concerning the available choices for piezoelectric materials for applications of this type, it is to be noted that the technical literature also is of value. One extensive work was published by the United States Air Force Cambridge Research Laboratory under the Report Number TR-73-0597 and is dated Oct. 1, 1973. That document is entitled: Microwave Acoustics Handbook, Vol. 1A by A. J. Slobodnik, E. D. Conway and R. T. Delmonico. That document is available to the public, at least through United States Air Force Library sources.

Figure 2:
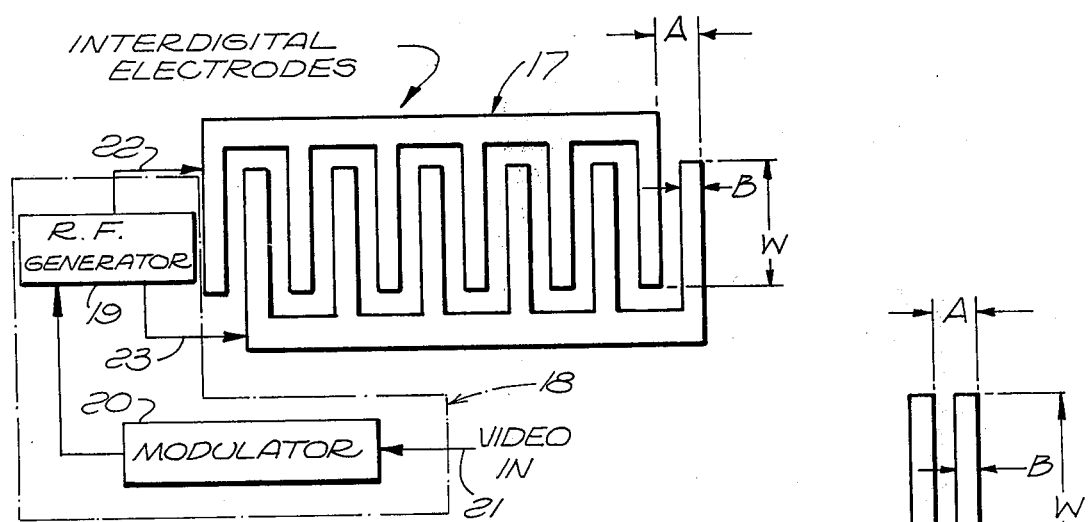
FIG. 2 is a schematic block diagram illustrating the input components and interdigital electrodes (magnified) of the acoustic wave launching transducer of FIG. 1.

A group of interleaved interdigital electrodes generally identified as 17 provide the launching transducer, whereby the surface acoustic wave is launched along the piezoelectric material. Referring momentarily to FIG. 2, the details of 17 are shown. The excitation 18 is also shown in more detail in FIG. 2, in that it includes an RF generator 19 and a modulator 20 to provide amplitude modulation of the RF signal generated by 19 in accordance with the video signal line introduced at 21. A radio frequency signal from the RF generator 19 is provided at 100 MHz, this signal being applied between the interleaved electrodes of the transducer 17, as indicated in FIG. 2, via connections 22 and 23. This radio frequency signal at 100 MHz is consistent with values for the dimensions A, A', B and W identified on FIG. 2 in accordance with the following tabulation:

$A = \lambda/2 = 17.5 \mu M$ $A' = 0.4$ mm $B = \lambda/4 = 8.75 \mu M$ $W \cong 80\lambda = 4$ mm In the above tabulation, dimensional values in $\mu M$ or angstrom are also identified in terms of wavelengths at the said 100 MHz frequency.

The so-called finger pair taps 14 through 16 and 14' through 16' typically, are actually 500 in number, 250 each side of the centerline 24 on FIG. 1. As previously indicated, the transit time for the acoustic surface wave over the full lengthwise dimension of the piezoelectric substrate covered by the said finger pair taps is that required to accommodate the full signal train or line, in the case described 62 microseconds. Accordingly, the centerline 24 is the nominal center of the scan line, and the centroid may lie at that centerline on either side thereof, depending upon the signal content. The concept of the centroid of such a signal line is, of course, well understood in these arts.

Figure 3:
FIG. 3 is a typical finger pair (magnified) of the relatively large plurality of interdigital pickup electrodes of FIG. 1.

FIG. 3 is a detail showing a typical finger pair, for example, 14. The dimensions in the foregoing table set forth with respect to the launching transducers 17 also apply to the interdigital electrodes constituting these finger pairs as illustrated in FIG. 3.

Consistent values in accordance with the foregoing, for the surface face dimensions of the piezoelectric substrate 11, are $L_1 = 21$ cm and $L_2 = 1$ cm. An acoustic absorbing material 25 as shown on FIG. 1, serves to absorb each acoustic wave as it reaches the end of the piezoelectric substrate 11, thereby preventing reflections. Simple bees wax has been found to be an effective acoustic wave absorber.

The dimension A' applies only to the finger pair taps and not to the launching transducer and is set at 0.4 mm based on the video modulation frequencies inherent in the system having the parameters hereinbefore described.

In addition to the piezoelectric substrate 11 mounted on the insulating (ceramic for example) base 13, a semiconductor substrate 12 is also mounted on 13 in juxtaposition with the leads connecting to the finger pair taps as indicated on FIG. 1. This semiconductor substrate forms a part of an integrated circuit arrangement providing the functions hereinafter described. Although it is not absolutely necessary that integrated circuits be provided, as a practical matter, where the interdigital electrode pairs of the finger pair taps are so numerous, and the spacing so relatively small, integrated circuit components connected thereto are by far the most practical solution, since each pair of finger taps requires its own pickup amplifier, typically W1 through W3 and W1' through W3', (as well as 250 first level summation circuits and a second level, 250 input summer) in the relatively small space occupied by the entire device.

All of the amplifiers W1 through W3 etc., to the left of the centerline 24 in FIG. 1, i.e., 250 in number in accordance with the previous information, are, for example, non-inverting amplifiers. To the right of centerline 24, amplifiers $W_1'$ through $W_3'$ etc., (250 in number) are then inverting amplifiers.

A necessary characteristic of this bank of 500 amplifiers is that through the use of attenuators with amplifiers of standard gain or through other means by which the individual gains of these amplifiers are predetermined, a weighting program is introduced. Each of these amplifiers weights its signal input in accordance with its position form the centerline 24. Tap pairs 14 and 14' receive the greatest weighting, i.e., have their signals amplified by the greatest amount, and pairs closest to the centerline and either side of 24 receive least weighting. The mathematical distribution of these weighting functions on either side of centerline 24 would normally be linear, that is, going out from either side of the centerline 24, the amplifier gains increase from one amplifier to the next by the same amount. It sould be mentioned at this time however, that another shape could be given to this gain distribution function, depending entirely upon the nature of the control signal desired from the overall device. That is to say, if the desired control situation required that some tracking device operative in conjunction with the device of the invention were designed to keep the signal centroid at or near the centerline 24, the increase of gain for each amplifier spreading out on either side of the centerline 24, might best be a more rapid function than would be provided by the aforementioned linear characteristic.

Additional integrated circuit elements include the first level summers of which summers 26, 27 and 28 are typical. As indicated, summer 26 is responsive to the end finger pair taps through amplifiers W1 and W1'. Similarly, summer 27 is responsive to W2 and W2' and summer 28 to W3 and W3', etc. Accordingly, if there are N=500 amplifiers corresponding to the 500 finger pair taps, there are N/2 or 250 first level summer circuits. The amplifiers, typically W1' through W3', to the right of centerline 24, being inverting amplifiers (or non-inverting if the amplifiers to the left, to wit, W1 through W3 typically were inverting) it will be seen that the outputs of the first level summers, typically 26 through 28, which are fed to the second level summer circuit 29 provide a means for outputting a discriminator-like output at terminal 30 from this summer 29.

The deposition of the interdigital electrodes, both in the launching transducers 17 and within the 500 finger pair taps, is readily accomplished by known photolithographic techniques. Typically, the deposition of these electrodes would be to a depth or a film thickness of 1000 to 2000 A (angstroms) Typical conductive materials for this type of deposition include aluminum, gold, or chrom-gold.

From the foregoing description, it will be realized that the output terminal 30 of FIG. 1 provides a signal (or control function) which may be readily used to guide a device such as a guided missile automatically to a designated target which is in the view of a television camera in the head of the missile. Other applications for the device of the invention include any circumstance where a time (or location) weighted output (centroid) is required to be generated very rapidly and where small size, realibility and low cost are important. Also, the device is obviously useful in the real time processing of wideband video data. The device could, of course, be built for much greater (or lower) bandwidth than the 4 MHz commercial television bandwidth assumed in the design example. Still further, the device could be employed for the equivalent processing of signal lines generated by infrared, radiometric, or radar censors.

In FIG. 1, a lead 31 is shown entering second level summer 29, this lead illustrating that blanking or gating signals controlling the availability of the control signal at output lead 30 would be readily possible, i.e., 62 $\mu$ sec. from the start of line scan.

It will be apparent to the skilled reader that the input line data need not actually be repetitive, and could in fact be "single-shot".

It will occur to those skilled in this art, once the principles of the present invention are understood, that various modifications and variations are possible within the spirit thereof. For example, the piezoelectric substrate might be in the shape of a tube with a launching transducer mounted to propagate the surface acoustic wave in a spiral around the tube with a much larger number of finger pair taps along this spiral length. Although the amplifiers and other processing circuits might be less conveniently connected, it will be apparent that this would be a design problem submissive to equivalent techniques as described in connection with FIG. 1. Such a relatively long path for the surface wave could produce a unit capable of processing an entire television signal frame, in a device still extremely small.

What is claimed is:

1. A video signal processor comprising:
    a piezoelectric substrate having at least one elongated dimension;
    first means for launching a surface acoustic wave along a surface of said piezoelectric substrate, said first means being responsive to an input signal representative of a video signal train;
    second means comprising a plurality N of interdigital electrode sensor pairs substantially uniformly distributed along the surface of said piezoelectric substrate so as to each receive an electric signal as said surface acoustic wave progresses, said sensor pairs being contained within said elongated dimension over a sensing length equal to the distance traveled by the leading edge of said surface wave over the duration of said video signal train;
    third means comprising N/2 first summation circuits, each of said summation circuits being connected to sum the signal generated at a discrete one of said pair sensors in the first half of said N sensor pairs with that generated by a corresponding sensor pair spaced by the same number of said pairs from the center of said plurality of N sensor pairs within the second half of said sensor pairs;
    fourth means within said third means for inverting the polarity of the detected signal from each of said sensor pairs in said second half of said N sensor pairs before application to said first summation circuits;
    and fifth means comprising a second summation circuit connected to sum the outputs of said first summation circuits to provide an output signal.

2. Apparatus according to claim 1 including sixth means for weighting the signal from each of said sensor pairs before application to said first summation circuits of said third means, said sixth means providing greatest weighting for sensor pairs farthest from the center of said plurality of N sensor pairs and least weighting for sensor pairs closest to the center of said plurality of N sensor pairs, the polarity and amplitude of said fifth means output signal thereby corresponding to the sense of the location of the centroid of said signal train and spacing with respect to said center of said plurality of sensor pairs, respectively.

3. Apparatus according to claim 2 in which said signal train is defined as corresponding to and having the duration of a scan line in a repetitive scanning system and said sixth means comprises N amplifiers each responsive to the signal output of a corresponding sensor pair, said amplifiers each providing a predetermined gain for each signal pair inputed to each of said first summers of said third means to produce said weighting.

4. Apparatus according to claim 1 in which said first means includes a radio frequency source, means for modulating said radio frequency source in accordance with said video signal train as a signal to be processed, and means including at least one pair of interdigital finger electrodes forming an input transducer connected to the modulated output of said radio frequency source and mounted at one end of said piezoelectric substrate outside said sensing length, but parallel to said sensor pairs of said second means.

5. Apparatus according to claim 3 in which said first means includes a radio frequency source, means for modulating said radio frequency source in accordance with said video signal train as a signal to be processed, and means including at least one pair of interdigital finger electrodes forming an input transducer connected to the modulated output of said radio frequency source and mounted at one end of said piezoelectric substrate outside said sensing length, but parallel to said sensor pairs of said second means.

6. Apparatus according to claim 4 in which said interdigital electrode sensor pairs are defined as including finger electrode pairs, and these and said finger electrodes of said transducer are deposited as conductive film on said piezoelectric substrate to a depth ranging between 1000 and 2000 angstroms approximately, said fingers have a width in the direction of said elongated dimension of approximately one quarter wavelength, a center-to-center spacing of approximately one half wavelength in the direction of said elongated dimension, and a length measured transverse to said elongated dimension on the order of 80 wavelengths, said wavelength measurements being based on the frequency of said ratio frequency source.

7. Apparatus according to claim 1 in which N is a sufficiently large number to provide a resolution on the order of 500 elements over said sensing length.

8. Apparatus according to claim 5 including an insulating base plane and semiconductor substrate, said piezoelectric substrate and said semiconductor substrate being mounted in juxtaposition along one elongated dimension edge of said piezoelectric substrate, and in which at least portions of said third, fourth and fifth means are provided as integrated circuits on said semiconductor substrate, thereby to provide direct electrical connections at least from said interdigital electrodes of said said sensor pairs to the circuits of said means provided on said semiconductor substrate.

9. Apparatus according to claim 5 in which said radio frequency source has a frequency at least in the VHF domain in order to minimize the physical size of said apparatus.

10. Apparatus according to claim 6 in which the material of said conductive film is selected from a group comprising aluminum, gold and chrome-gold, and said piezoelectric substrate material is lithium niobate.

* * * * *